US010289482B2

(12) United States Patent
Kodera et al.

(10) Patent No.: US 10,289,482 B2
(45) Date of Patent: May 14, 2019

(54) MEMORY DEVICE THAT UPDATES PARAMETERS TRANSMITTED TO A HOST BASED ON OPERATIONAL SETTINGS

(71) Applicant: TOSHIBA MEMORY CORPORATION, Tokyo (JP)

(72) Inventors: Shunsuke Kodera, Yokohama Kanagawa (JP); Toshihiko Kitazume, Kawasaki Kanagawa (JP); Kenichirou Kada, Yokohama Kanagawa (JP); Nobuhiro Tsuji, Yokohama Kanagawa (JP); Shinya Takeda, Yokohama Kanagawa (JP); Tetsuya Iwata, Yokohama Kanagawa (JP); Yoshio Furuyama, Yokohama Kanagawa (JP); Hirosuke Narai, Meguro Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 16 days.

(21) Appl. No.: 15/062,011

(22) Filed: Mar. 4, 2016

(65) Prior Publication Data

US 2017/0060477 A1    Mar. 2, 2017

(30) Foreign Application Priority Data

Aug. 28, 2015    (JP) ................... 2015-169449

(51) Int. Cl.
*G11C 29/00*    (2006.01)
*G06F 11/10*    (2006.01)
(Continued)

(52) U.S. Cl.
CPC .......... *G06F 11/1068* (2013.01); *G11C 16/20* (2013.01); *G11C 29/12* (2013.01); *G11C 16/0483* (2013.01)

(58) Field of Classification Search
CPC ............. G06F 11/1068; G06F 11/1048; G06F 11/10766; G11C 16/20; G11C 16/0483; G11C 29/12
(Continued)

(56) References Cited

U.S. PATENT DOCUMENTS 8,755,246 B2    6/2014 Kanda et al.
2006/0117214 A1*    6/2006 Sugiura ............... G06F 11/1068
714/5.11
(Continued)

FOREIGN PATENT DOCUMENTS

JP    2008-535131 A    8/2008
JP    2012203940 A    10/2012
(Continued)

OTHER PUBLICATIONS

Toshiba MOS Digital Integrated Circuit Silicon Gate CMOS, TC58NVG0S3HTA00, Aug. 31, 2012, 51 pages.
(Continued)

*Primary Examiner* — Christine T. Tu
(74) *Attorney, Agent, or Firm* — Kim & Stewart LLP

(57) ABSTRACT

A memory device includes a semiconductor memory unit and a controller circuit configured to communicate with a host through a serial interface and access the semiconductor memory unit in response to commands received through the serial interface. The controller circuit, in response to a host command to read parameters of the memory device, updates at least one of parameters of the memory device stored in the memory device based on operational settings of the memory device, and transmits the updated parameters through the serial interface to the host.

14 Claims, 20 Drawing Sheets

(51) Int. Cl.
*G11C 29/12* (2006.01)
*G11C 16/20* (2006.01)
*G11C 16/04* (2006.01)

(58) Field of Classification Search
USPC ....... 714/764, 765, 763, 773, 774, 704, 708, 714/4.5, 6.1, 6.11, 6.21, 15, 20, 21, 32, 714/33, 35, 37, 39, 46, 48, 49
See application file for complete search history.

(56) References Cited

U.S. PATENT DOCUMENTS

| | | | |
|---|---|---|---|
| 2014/0140152 A1 | 5/2014 | Takeyama et al. | |
| 2014/0245048 A1 | 8/2014 | Sato et al. | |
| 2015/0100854 A1* | 4/2015 | Lu | G06F 11/1048 714/773 |
| 2016/0034353 A1* | 2/2016 | Tuers | H03M 13/1111 714/764 |
| 2016/0378590 A1* | 12/2016 | Roh | G11C 29/52 714/768 |

FOREIGN PATENT DOCUMENTS

| | | |
|---|---|---|
| JP | 2014102867 A | 6/2014 |
| JP | 2014164471 A | 9/2014 |
| TW | 200935234 A | 8/2009 |
| WO | 2012/001917 A1 | 1/2012 |

OTHER PUBLICATIONS

Toshiba MOS Digital Integrated Circuit Silicon Gate CMOS, TC58BVG0S3HTA00, Aug. 31, 2012, 44 pages.
Universal Serial Bus Specification, Revision 2.0, Apr. 27, 2000, 12 pages.
Taiwan Office Action dated Jan. 25, 2017, filed in Taiwan counterpart Application No. 105104792, 10 pages (with translation).
Micron NAND Flash Memory, Serial Peripheral Interface (SPI), MT29F1G01AAADD, Rev. B Feb. 2011 EN, 2010 Micron Technology, Inc., pp. 1-43.
Taiwanese Office Action dated Jun. 23, 2017 filed in Taiwanese counterpart Patent Application No. 105104792 (7 pages) with english translation.
NAND Flash Memory Serial Peripheral Interface(SPI), Data sheet, MT29F1G01AAADD, Micron Technology, Inc., 2010, pp. 1, 6-36.

* cited by examiner

FIG. 3

| Pin no. | Pin function |
|---|---|
| 1 | Hold input(/HOLD) / serial data output3(SO3) |
| 2 | Power supply(Vcc) |
| 3 | No connection(NC) |
| 4 | No connection(NC) |
| 5 | No connection(NC) |
| 6 | No connection(NC) |
| 7 | Chip select(/CS) |
| 8 | Serial data output(SO) / serial data output1(SO1) |
| 9 | Write protect(/WP) / serial data output2(SO2) |
| 10 | Ground(Vss) |
| 11 | No connection(NC) |
| 12 | No connection(NC) |
| 13 | No connection(NC) |
| 14 | No connection(NC) |
| 15 | Serial data input(SI) / serial data output0(SO0) |
| 16 | Serial clock input(SCK) |

FIG. 4

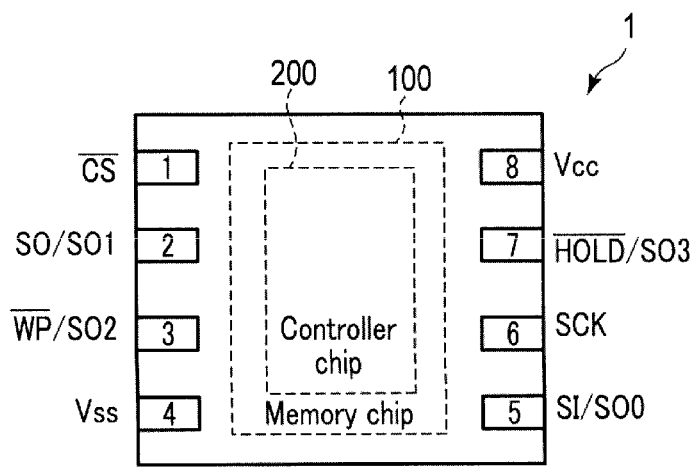

FIG. 5

| Pin no. | Pin function |
|---|---|
| 1 | Chip select(/CS) |
| 2 | Serial data output(SO) / serial data output1(SO1) |
| 3 | Write protect(/WP) / serial data output2(SO2) |
| 4 | Ground(Vss) |
| 5 | Serial data input(SI) / serial data output0(SO0) |
| 6 | Serial clock input(SCK) |
| 7 | Hold input(/HOLD) / serial data output3(SO3) |
| 8 | Power supply(Vcc) |

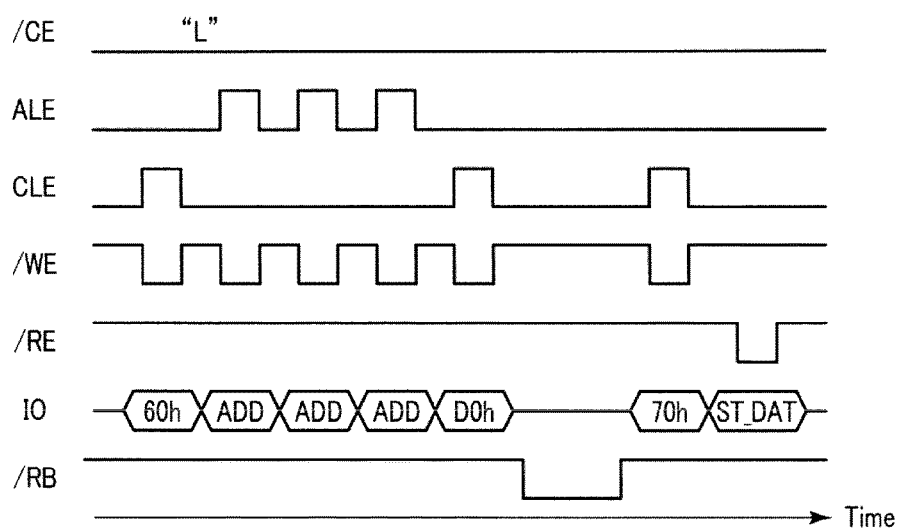

FIG. 19

| Byte | Parameter |
| --- | --- |
| 0-31 | Reserved |
| 32-43 | Device manufacturer |
| 44-63 | Device model |
| 64 | Manufacture ID |
| 65-79 | Reserved |
| 80-83 | Number of data bytes per page |
| 84-85 | Number of spare bytes per page |
| 86-89 | Number of data bytes per partial page |
| 90-91 | Number of spare bytes per partial page |
| 92-95 | Number of pages per block |
| 96-99 | Number of blocks per unit |
| 100 | Number of logical units |
| 101 | Reserved |
| 102 | Number of bits per cell |
| 103-104 | Bad blocks maximum per unit |
| 105-106 | Block endurance |
| 107 | Guaranteed valid blocks at beginning of target |
| 108-109 | Reserved |
| 110 | Number of programs per page |
| 111 | Reserved |
| 112 | Number of ECC bits |
| 113-127 | Reserved |
| 128 | I/O pin capacitance |
| 129-132 | Reserved |
| 133-134 | tPROG maximum page program time |
| 135-136 | tBERS maximum block erase time |
| 137-138 | tR maximum page read time |
| 139-253 | Reserved |
| 254-255 | Integrity CRC |
| 256-511 | Value of bytes 0-255 |
| 512-767 | Value of bytes 0-255 |

MEMORY DEVICE THAT UPDATES PARAMETERS TRANSMITTED TO A HOST BASED ON OPERATIONAL SETTINGS

CROSS-REFERENCE TO RELATED APPLICATION

This application is based upon and claims the benefit of priority from Japanese Patent Application No. 2015-169449, filed Aug. 28, 2015, the entire contents of which are incorporated herein by reference.

FIELD

An embodiment described herein relates generally to a memory device, in particular, a memory device that updates parameters transmitted to a host based on operational settings.

BACKGROUND

NAND-type flash memory is widely known as a memory device.

DESCRIPTION OF THE DRAWINGS

FIG. 3 illustrates functions of external terminals of the memory system according to the embodiment.

FIG. 4 is an exterior plan view of another memory system according to the embodiment.

FIG. 5 illustrates functions of external terminals of the memory system shown in FIG. 4.

FIGS. 15-16 are timing charts of various signals during erasing of data in the memory system according to the embodiment.

FIG. 17 is a schematic diagram of a feature table according to the embodiment.

FIG. 19 illustrates content of information held in a parameter table according to the embodiment.

DETAILED DESCRIPTION

Figure 1:
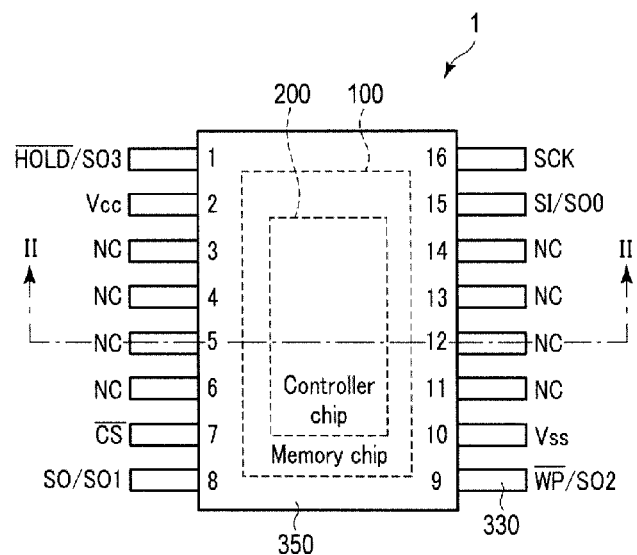
FIG. 1 is an exterior plan view of a memory system according to an embodiment.

One or more embodiments provide a memory system capable of improving operation reliability.

In general, according to an embodiment, a memory device includes a semiconductor memory unit and a controller circuit configured to communicate with a host through a serial interface and access the semiconductor memory unit in response to commands received through the serial interface. The controller circuit, in response to a host command to read parameters of the memory device, updates at least one of parameters of the memory device stored in the memory device based on operational settings of the memory device, and transmits the updated parameters through the serial interface to the host.

Hereinafter, embodiments will be described with reference to the drawings. In the following description, configuring elements having the same function and configuration are described with common reference numerals.

A memory system according to an embodiment will be described.

1. Configuration

1.1 Entire Configuration of Memory System

First, an entire configuration of the memory system according to the present embodiment will be described with reference to FIGS. 1 and 2. FIG. 1 is an exterior plan view of the memory system according to the present embodiment, and FIG. 2 is a cross-sectional view thereof taken along the line II-II in FIG. 1.

As illustrated, a memory system 1 includes two semiconductor chips (modules) 100 and 200. The semiconductor chip (memory chip) 100 includes a semiconductor memory such as a NAND-type flash memory, and the semiconductor chip 200 (controller chip) controls a controller which controls the memory chip 100. The semiconductor chips 100 and 200 are mounted on a lead frame 300, and are packaged by being sealed with a resin 350.

Figure 2:
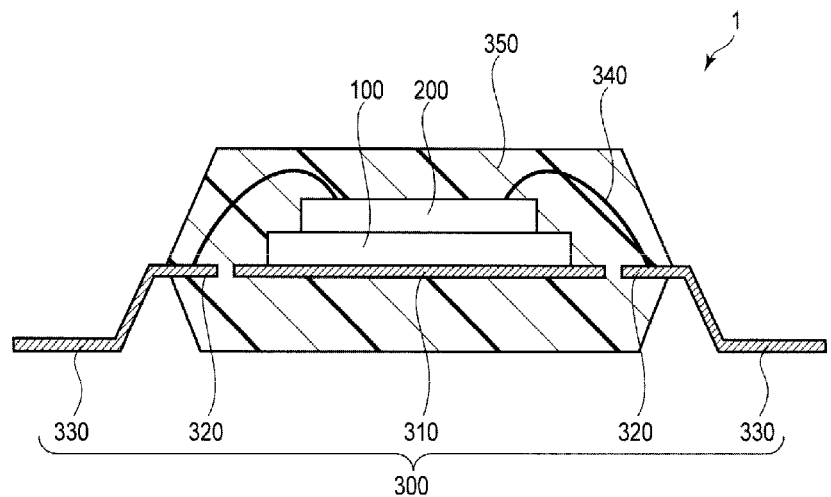
FIG. 2 is a cross-sectional view of the memory system according to the embodiment.

More specifically, as illustrated in FIG. 2, the memory chip 100 is mounted on a die pad 310 of the lead frame 300, and the controller chip 200 is superposed on the memory chip 100.

The controller chip 200 is connected to an inner lead 320 of the lead frame via, for example, a bonding wire 340, and is also connected to the memory chip 100 via a bonding wire (not illustrated). The memory chip 100, the controller chip 200, the die pad 310, the inner lead 320, and the bonding wire 340 are sealed with, for example, the resin 350.

The inner lead 320 is connected to an outer lead 330 which is exposed to the outside of the resin 350. The outer lead 330 functions as an external connection terminal (external connection pin) of the memory system 1. In FIG. 1, sixteen external connection terminals including a first pin to a sixteenth pin are provided. The memory system 1 performs communication with a host apparatus which controls the memory system 1 (more specifically, accesses the memory chip) via the pins.

FIG. 3 illustrates functions of the respective pins. As illustrated, the first pin is used to receive a control signal /HOLD, or to output serial data SO3. The control signal /HOLD is asserted (has an "L" level) when communication between the host apparatus and the memory system 1 is temporarily stopped. The second pin receives a power supply voltage Vcc. The third to sixth pins and the eleventh to fourteenth pins are reserved pins, and may be used, for example, when a certain signal or data are required to be transmitted and received in the future. The seventh pin receives a chip select signal/CS. The chip select signal/CS is a signal for activating the memory chip 100 and the controller chip 200 (in other words, a signal is asserted when accessing the memory system 1), and is asserted (has an "L" level), for example, at a timing at which the host apparatus inputs a command to the memory system 1. The eighth pin is used to output serial data (SO or SO1). The ninth pin is used to receive a control signal /WP or to output serial data (SO2). The control signal /WP is a write protect signal, and is asserted (has an "L" level) when writing data to the memory chip is inhibited. The tenth pin receives a reference potential Vss. The fifteenth pin is used to receive serial data (SI) or to output serial data (SO0). The sixteenth pin receives a serial clock signal SCK.

The pin configuration conforms to the serial peripheral interface (SPI). The first pin, the eighth pin, the ninth pin, and the fifteenth pin are arbitrarily selected for use in outputting serial data, and can output data to the host apparatus at 1-time speed, 2-time speed or 4-time speed.

FIG. 4 illustrates an example of a package configuration which is different from the one illustrated in FIG. 1. In FIG. 4, eight external connection terminals including a first pin to an eighth pin are provided. FIG. 5 illustrates functions of the respective pins shown in FIG. 4.

As illustrated, the first pin receives the chip select signal/CS. The second pin outputs the serial data SO and SO1. The third pin receives the write protect signal /WP or outputs the serial data SO2. The fourth pin receives the reference potential Vss. The fifth pin receives the serial data SI or outputs the serial data SO0. The sixth pin receives the serial clock. The seventh pin receives the control signal /HOLD or outputs the serial data SO3. The eighth pin receives the power supply voltage Vcc. Also in this case, the pin configuration conforms to the SPI.

Figure 6:
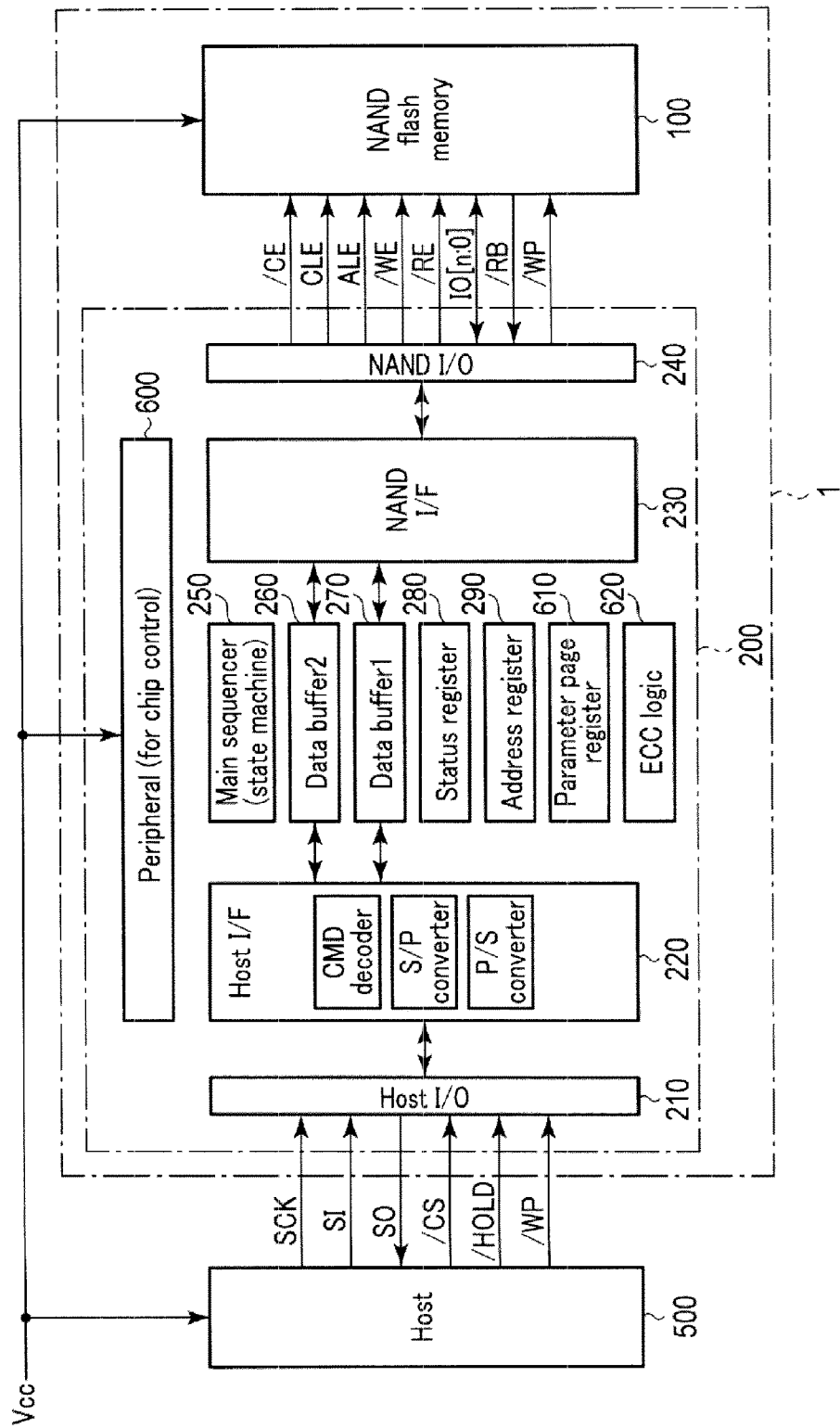
FIG. 6 is a block diagram of the memory system according to the embodiment.

FIG. 6 is a functional block diagram illustrating an internal configuration of the memory system 1. Hereinafter, the memory chip 100 is referred to as a NAND-type flash memory 100, and the controller chip 200 is simply referred to as a controller 200.

As illustrated, the memory system 1 includes the NAND-type flash memory 100 and the controller 200.

The NAND-type flash memory 100 includes a plurality of memory cells and stores data in a nonvolatile manner. The controller 200 is connected to the NAND-type flash memory 100 via NAND buses, and is connected to a host apparatus 500 via SPI buses. The controller 200 controls access to the NAND-type flash memory 100.

Each of the NAND buses performs transmission and reception of signals based on a NAND interface protocol. Specific examples of the signals include a chip enable signal /CE, an address latch enable signal ALE, a command latch enable signal CLE, a write enable signal /WE, a read enable signal /RE, a ready busy signal /RB, an input or output signal I/O, and a write protect signal /WP.

The signal /CE is asserted in a low level so as to activate the NAND-type flash memory 100, when accessing the NAND-type flash memory 100. The signals CLE and ALE are used to notify the NAND-type flash memory 100 that input signals I/O to the NAND-type flash memory 100 are respectively a command and an address. The signal /WE is asserted in a low level so that the input signal I/O is input to the NAND-type flash memory 100. The signal /RE is also asserted in a low level so that the output signal I/O is read from the NAND-type flash memory 100. The ready busy signal /RB indicates whether the NAND-type flash memory 100 is in a ready state (a state of being capable of receiving a command from the controller 200) or in a busy state (a state of being incapable of receiving a command from the controller 200), and a low level thereof indicates the busy state. The input or output signal I/O is, for example, an 8-bit (n=8) signal. The input or output signal I/O is the entity of data which are transmitted and received between the NAND-type flash memory 100 and the controller 200, and includes a command, an address, data to be written, and read data. The signal /WP is a signal for prohibiting data from being written to the NAND-type flash memory 100.

The SPI buses are substantially similar to the ones described with reference to FIGS. 3 and 5.

1.2 Configuration of Controller 200

Next, with reference to FIG. 6, details of a configuration of the controller 200 will be described. As illustrated, the controller 200 includes a host input/output circuit 210, a host interface circuit 220, a NAND interface circuit 230, a NAND input/output circuit 240, a sequencer (state machine) 250, data buffers 260 and 270, a status register 280, an address register 290, a peripheral circuit 600, a parameter page register 610, and an ECC circuit 620.

The host input/output circuit 210 functions as a buffer of signals which are transmitted to and received from the host apparatus 500. The signals SCK, SI, /CS, /HOLD and /WP are first received by the host input/output circuit 210 and are then output to the host interface circuit 220.

The host interface circuit 220 receives the signal SI in synchronization with the signal SCK. The host interface circuit 220 transmits the signal SO which is output in synchronization with the signal SCK, to the host apparatus 500 via the host input/output circuit 210.

The host interface circuit 220 controls transmission and reception of signals with the host apparatus 500 via the host input/output circuit 210. The host interface circuit 220 functions as a serial/parallel converter and a parallel/serial converter. For example, the input signal SI from the host apparatus 500 is converted from a serial signal into a parallel signal, and data read from the NAND-type flash memory 100 is converted from a parallel signal into a serial signal. If the input signal SI is a command, the host interface circuit 220 functions as a command decoder and decodes the received command. A decoded result is output to, for example, the sequencer 250.

The data buffers 260 and 270 temporarily holds written data that are received from the host apparatus 500, via the host interface circuit 220. Data read from the NAND-type flash memory 100 are received via the NAND interface circuit 230 and temporarily held.

The status register 280 holds various kinds of status information of the memory system 1. For example, a feature table (described below) is held.

The address register 290 holds an address received from the host apparatus 500, via the host interface circuit 220.

The NAND interface circuit 230 controls transmission and reception of signals to and from the NAND-type flash memory 100 via the NAND input/output circuit 240. The NAND interface circuit 230 issues various commands conforming to the NAND interface protocol in response to a command from the sequencer 250, and outputs the commands to the NAND-type flash memory 100 along with an address in the address register 290 via the NAND input/output circuit 240. During writing of data, the data in the data buffer 260 and/or 270 is output to the NAND-type flash memory 100 via the NAND input/output circuit 240. During reading of data, data read from the NAND-type flash memory 100 is transmitted to the data buffer 260 and/or 270.

The NAND input/output circuit 240 functions as a buffer of signals which are transmitted to or received from the NAND-type flash memory 100. The NAND input/output circuit 240 asserts or deasserts the signals /CE, CLE, ALE, /WE, /RE and /WP in response to commands from the NAND interface circuit 230. During reading of data, the NAND input/output circuit 240 temporarily holds a signal IC (read data) and transmits the signal to the NAND interface circuit 230. During writing of data, the NAND input/output circuit 240 temporarily holds a signal IC (written data) and transmits the signal to the NAND-type flash memory 100. The ready busy signal /RB is received from the NAND-type flash memory 100 and is transmitted to the NAND interface circuit 230.

The sequencer 250 controls the entire operation of the controller 200. For example, if a data reading request is received from the host apparatus 500, the sequencer 250 instructs the NAND interface circuit 230 to execute an operation for performing a reading operation. If a data writing request is received from the host apparatus 500, the sequencer 250 instructs the NAND interface circuit 230 to execute an operation for performing a reading operation. The feature table in the status register 280 is updated based on status information received from the NAND-type flash memory 100.

The ECC circuit 620 performs error detection and error correction processes. More specifically, during writing of data, ECC parity is generated for each set (hereinafter, referred to as "data pair") of a sector and a spare area provided in the sector based on data received from the host apparatus 500. The ECC circuit 620 transmits the ECC parity and the data pair to the data register 140 of the NAND-type flash memory 100. During reading of data, the ECC circuit 620 decodes each data pair and detects the presence or absence of an error based on ECC parity included in data transmitted from the data register 140 to the controller 200. If an error is detected, a bit position thereof is specified, and the error is corrected. The number of error bits which can be corrected for each data pair is, for example, 8 bits per data pair in the present embodiment. The ECC circuit 620 may output the number of error bits detected in each data pair to the status register as status information.

The parameter page register 610 holds parameter page data (described below). The parameter page data are information inherent to the memory system 1.

The peripheral circuit 600 receives the power supply voltage Vcc from an external device, transmits the voltage to each circuit block, and performs other control which is necessary in an operation of the controller 200.

1.3 Configuration of NAND-Type Flash Memory 100

Figure 7:
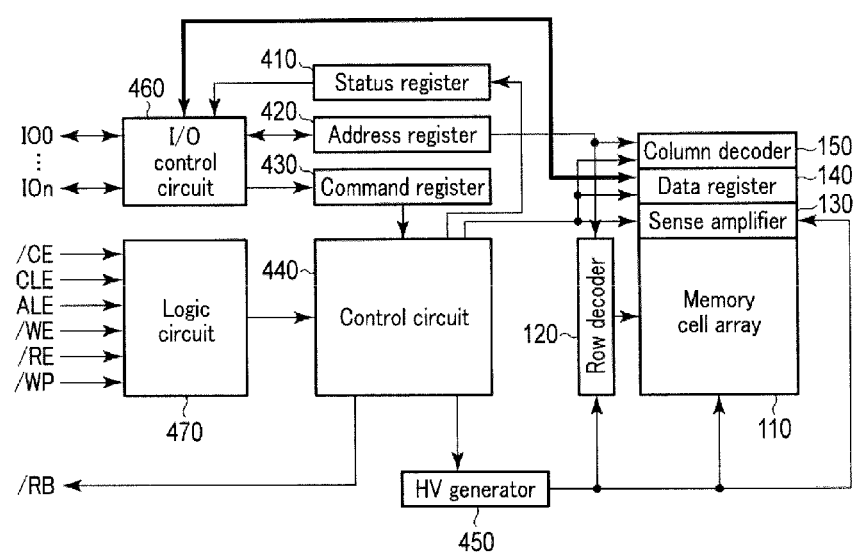
FIG. 7 is a block diagram of a semiconductor memory device according to the embodiment.

Next, with reference to FIG. 7, a configuration of the NAND-type flash memory 100 will be described. FIG. 7 is a block diagram of the NAND-type flash memory 100.

As illustrated, the NAND-type flash memory 100 includes a memory cell array 110, a row decoder 120, a sense amplifier 130, a data register 140, a column decoder 150, a status register 410, an address register 420, a command register 430, a control circuit 440, a voltage generation circuit 450, an input/output control circuit 460, and a logic circuit 470.

The memory cell array 110 includes a plurality of non-volatile memory cells arranged in rows and columns. Memory cells in the same row are connected to the same word line, and memory cells in the same column are connected to the same bit line. Reading and writing of data are collectively performed on a plurality of memory cells connected to the same word line. This unit of the reading and writing of data is referred to as a page. Data corresponding to one page includes net data and management data. The net data are managed in the unit called a sector. For example, in the present embodiment, one page includes four sectors, and each sector has a data size of 512 bytes. The management data include, for example, ECC data (parity) for correcting errors. The error correction is performed in each sector. Therefore, the management data include ECC data which are prepared for each sector. Erasing of data is collectively performed in the units of a plurality of pages. The units are referred to as a block.

The row decoder 120 decodes a row address for designating a row of the memory cell array 110. A word line is selected based on a decoded result, and voltages which are required to write, read, and erase data are applied thereto.

During reading of data, the sense amplifier 130 senses data read from the memory cell array 110 and transmits the data to the data register 140. During writing of data, data in the data register 140 are transmitted to the memory cell array 110.

The data register 140 temporarily holds write data or read data corresponding to one page.

The column decoder 150 decodes a column address of a column of the memory cell array 110. Based on a decoded result, data are transmitted to the data register during writing of data, and data are read from the data register during reading of data.

The logic circuit 470 receives the signals /CE, CLE, ALE, /WE, /RE, and /WP from the controller 200.

The input/output control circuit 460 receives a signal IO [n:0]. If the signal IO is an address (if ALE="H"), the input/output control circuit 460 holds the address in the address register 420. If the signal IO is a command (if CLE="H"), the command is held in the command register 430. If the signal IO is data (if ALE=CLE="L"), the data are held in the data register 140.

The status register 410 holds various kinds of status information of the NAND-type flash memory 100. The status information includes information indicating the number of error bits provided from the ECC circuit 620, and information indicating whether or not a writing operation and a erasing operation is successful (passed) or unsuccessful (failed), provided from the control circuit 440.

The control circuit 440 controls the entire NAND-type flash memory 100 based on commands held in the command register 430 and various signals input to the logic circuit 470. The control circuit 440 generates the ready busy signal /RB and outputs the signal to the controller 200.

The voltage generation circuit 450 generates voltage required in data writing, reading and erasing operations based on a command from the control circuit 440, and supplies the voltages to the memory cell array 110, the row decoder 120, and the sense amplifier 130.

2. Operations

Next, data reading, writing, and erasing operations in the memory system according to the present embodiment will be described, focusing on signals which are transmitted and received via the SPI buses and the NAND buses.

2.1 Reading Operation

First, the reading operation will be described. The reading operation substantially includes the following three steps.

(1) Reading of data from the NAND-type flash memory: Through this step, data are read from the NAND-type flash memory 100 to the controller 200.

(2) Feature table reading (referred to as Get feature in some cases): Through this step, whether the memory system 1 is in a busy state or a ready state is determined, that is, whether or not the operation in the step (1) is completed is determined.

(3) Reading of data from the controller 200: Through this step, the data read to the controller 200 in the step (1) are read to the host apparatus 500.

Figure 8:
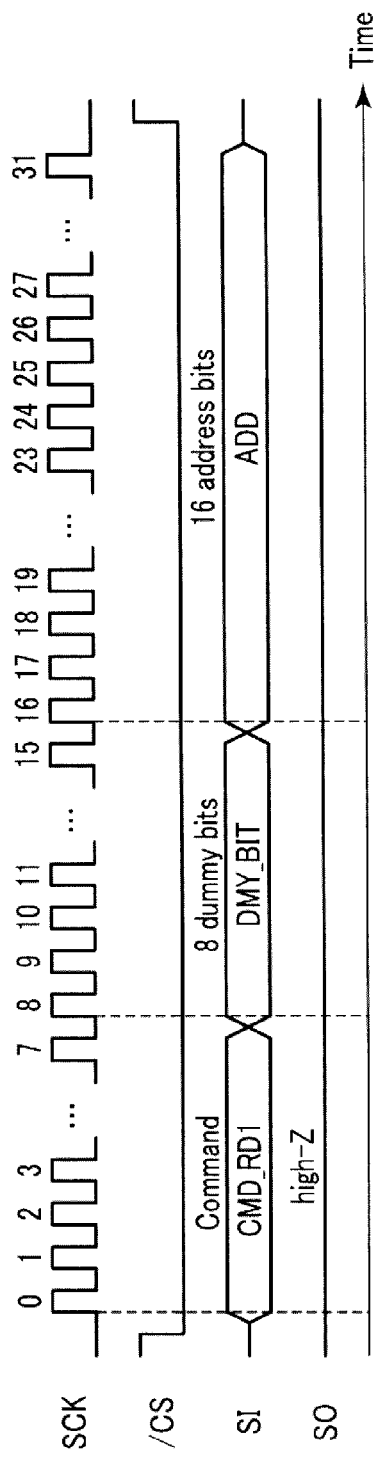
FIGS. 8-11 are timing charts of various signals during reading of data in the memory system according to the embodiment.

FIG. 8 is a timing chart of various signals on the SPI buses during execution of the step (1). As illustrated, the host apparatus 500 asserts the signal /CS, issues a first read command CMD_RD1 as the signal SI, and also issues the clock SCK.

The host interface circuit 220 of the controller 200 recognizes the signal SI when the signal /CS is asserted and the initial clock SCK is received, as a command. The command is, for example, an 8-bit signal which is input for 8 clock cycles. The first read command CMD_RD1 is received, and then the sequencer 250 starts a data reading sequence.

Next, the host apparatus 500 transmits dummy bits DMY_ BIT to the controller 200, for example, for 8 clock cycles, and then transmits an address ADD to the controller 200, for example, for 16 clock cycles. After the address ADD is transmitted, the host apparatus 500 deasserts the signal/CS. The address ADD is an address for designating a block and a page in the NAND-type flash memory 100, and is held in the address register 290.

As described above, when a specific command is received, what kind of signal is subsequently input (command sequence) is defined in advance. In other words, for example, if the first read command CMD_RD1 is received, the controller 200 recognizes that the signal SI which is input for subsequent 8 clock cycles is meaningless dummy data, and the signal SI which is input subsequent 16 clock cycles is a substantial address signal.

Figure 9:
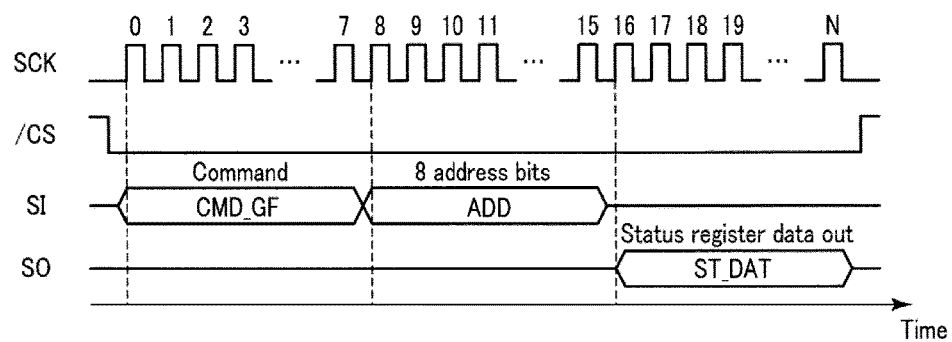

The operation in the step (2) is performed following the operation in the step (1). FIG. 9 is a timing chart of various signals on the SPI buses during execution in the step (2). As illustrated, the host apparatus 500 asserts the signal /CS again, issues a Get feature command CMD_GF as the signal SI, and also issues the clock SCK.

Next, the host apparatus 500 transmits an address ADD to the controller 200, for example, for 8 clock cycles. The address ADD is an address in the feature table, and is an address for naturally designating a region in which ready busy information is stored. In the controller 200, after the address ADD is received, the host interface circuit 220 reads an entry designated in the feature table from the status register 280 in response to a command from the sequencer 250, and transmits the entry to the host apparatus 500 as 8-bit status data ST_DAT for 8 clock cycles. The status data ST_DAT includes the ready busy information. After the status data ST_DAT is received, the host apparatus 500 deasserts the signal /CS.

Figure 10:
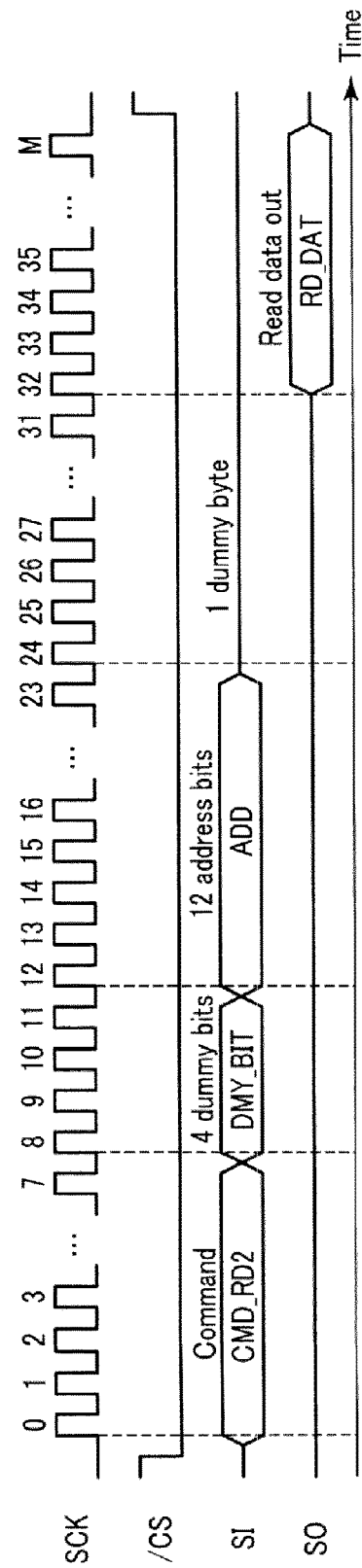

If the received status data ST_DAT indicates that the memory system 1 is in a ready state, the operation in the step (3) is performed. FIG. 10 is a timing chart of various signals on the SPI buses during execution of the step (3). As illustrated, the host apparatus 500 asserts the signal /CS, issues a second read command CMD_RD2 as the signal SI, and also issues the clock SCK.

Next, the host apparatus 500 transmits dummy bits DMY_ BIT to the controller 200, for example, for 4 clock cycles, and then transmits an address ADD to the controller 200, for example, for 12 clock cycles. The address ADD designates a region in the data buffer 260 or 270 of the controller 200, and designates a column of a page in the NAND-type flash memory 100. The address ADD is held in the address register 290. Then, the host interface circuit 220 reads data from the data buffer 260 or 270, for example, under the control of the sequencer 250. After the 8 clock cycles, the host interface circuit 220 transmits the data RD_DAT read from the data buffer 260 or 270 to the host apparatus 500.

Figure 11:
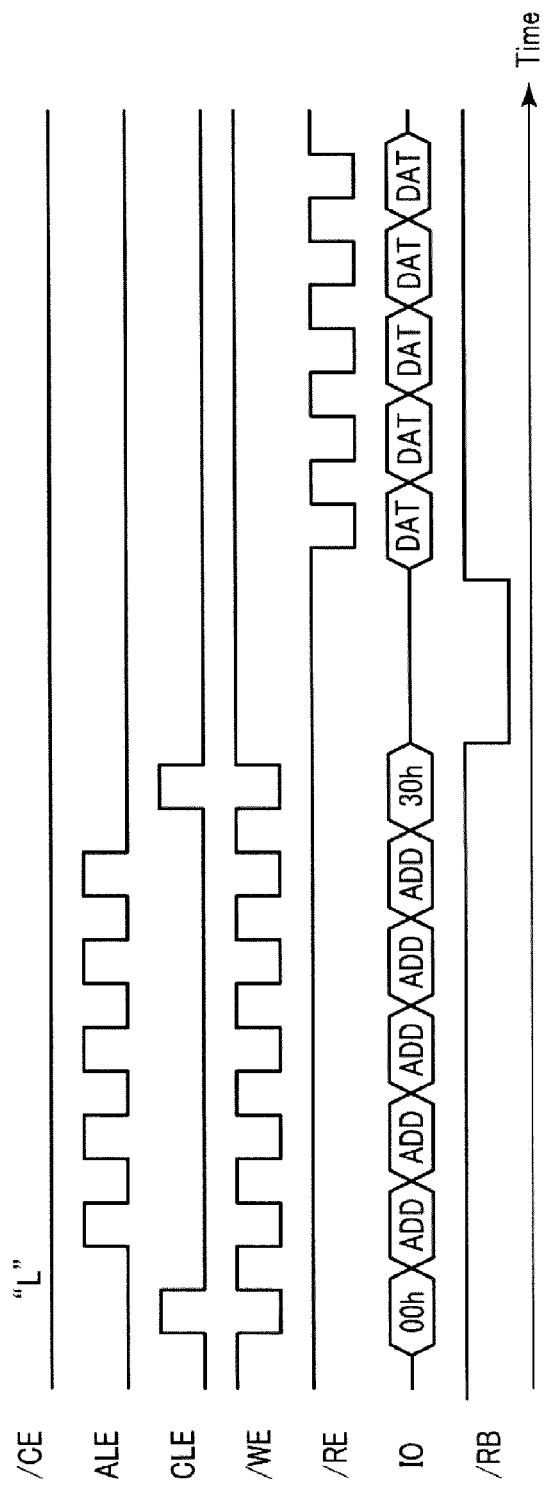

FIG. 11 is a timing chart of various signals on the NAND bus during operation of the step (1). After the first read command CMD_RD1 is received in the controller 200, the NAND interface circuit 230 issues an address input command "00h", for example, under the control of the sequencer 250, and transmits the command to the NAND-type flash memory 100. Subsequently, an address ADD is transmitted to the NAND-type flash memory 100, for example, for 5 clock cycles, and then a read command "30h" is issued and transmitted to the NAND-type flash memory 100. The address ADD includes addresses indicating a block, a page, and a column, held in the address register 290 in the operations illustrated in FIGS. 8 and 10.

An operation of reading data from the memory cell array 110 is started in the NAND-type flash memory 100 in response to the command "30h", and thus the NAND-type flash memory 100 is brought into a busy state (/RB="L").

If reading of the data from the memory cell array 110 is completed, the NAND-type flash memory 100 is brought into a ready state. The controller 200 toggles the signal /RE in response thereto. Then, the data are transmitted from the NAND-type flash memory 100 to the controller 200 in synchronization with the signal /RE.

2.2 Writing Operation

Next, the writing operation will be described. The writing operation substantially includes the following three steps.

(1) Transmission of data from the host apparatus 500 to the controller 200

(2) Writing of the transmitted data in the NAND-type flash memory 100

(3) Feature table reading (Get feature): Through this step, whether writing of the data in the NAND-type flash memory 100 is passed or failed is determined.

Figure 12:
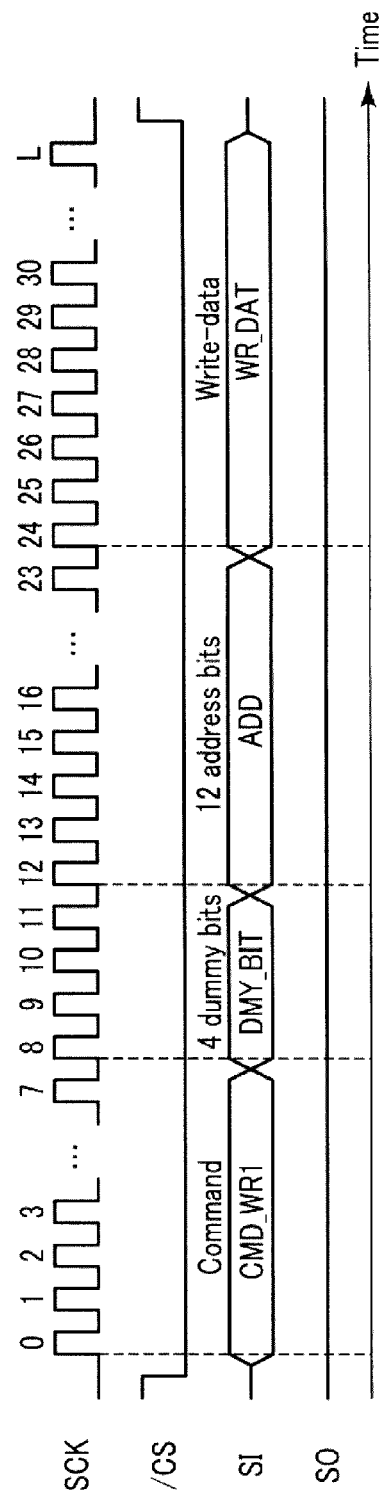
FIGS. 12-14 are timing charts of various signals during writing of data in the memory system according to the embodiment.

FIG. 12 is a timing chart of various signals on the SPI buses during execution of the step (1). As illustrated, the host apparatus 500 asserts the signal /CS, issues a first write command CMD_WR1 as the signal SI, and also issues the clock SCK. If the first write command CMD_WR1 is received, the sequencer 250 starts a data writing sequence.

Next, the host apparatus 500 transmits dummy bits DMY_ BIT to the controller 200, for example, for 4 clock cycles, and then transmits an address ADD to the controller 200, for example, for 12 clock cycles. The address ADD is an address for designating a region in the data buffer 260 or 270, and is an address for designating a column of a page in the NAND-type flash memory 100. The address ADD is held in the address register 290. The host apparatus 500 transmits write data WR_DAT to the controller 200. The write data WR_DAT is held in the region corresponding to the address ADD received right before, in the data buffer 260 or 270. After the data WR_DAT is transmitted, the host apparatus 500 deasserts the signal /CS.

Figure 13:
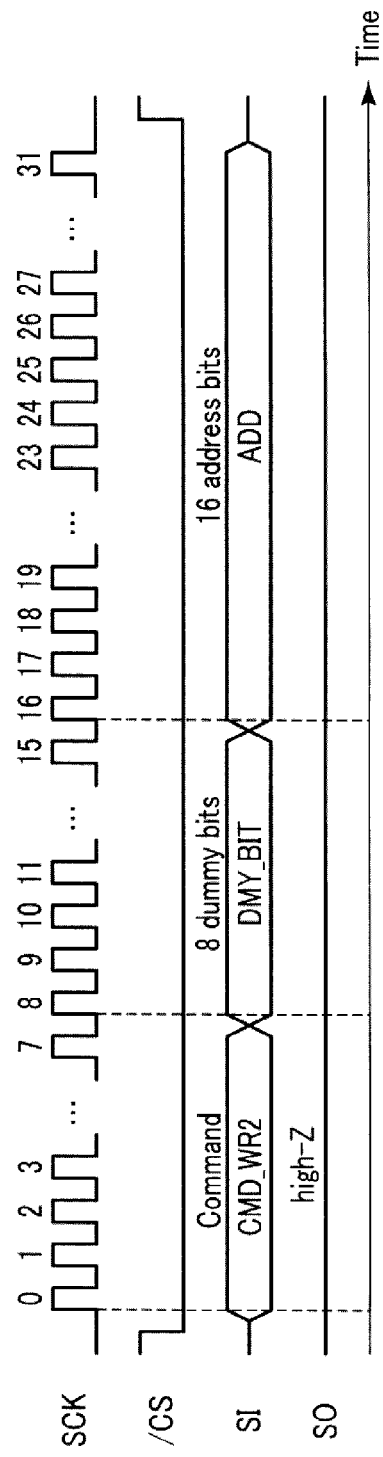

The step (2) is performed following the step (1). FIG. 13 is a timing chart of various signals on the SPI bus during execution of the step (2). As illustrated, the host apparatus 500 asserts the signal /CS again, issues a second write command CMD_WR2 as the signal SI, and also issues the clock SCK. If the second write command CMD_WR2 is received, the sequencer 250 recognizes that a command for the step (2) is received.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates a block and a page in the NAND-type flash memory 100, and is held in the address register 290. After the address ADD is transmitted, the host apparatus 500 deasserts the signal /CS.

The step (3) is performed following the step (2). A command sequence in this operation is the same as in FIG. 9 referred to for description of the reading operation. If the received status data ST_DAT indicates that the memory system 1 is in a ready state, the host apparatus 500 subsequently makes a request for information indicating whether writing of data is passed or failed.

Figure 14:
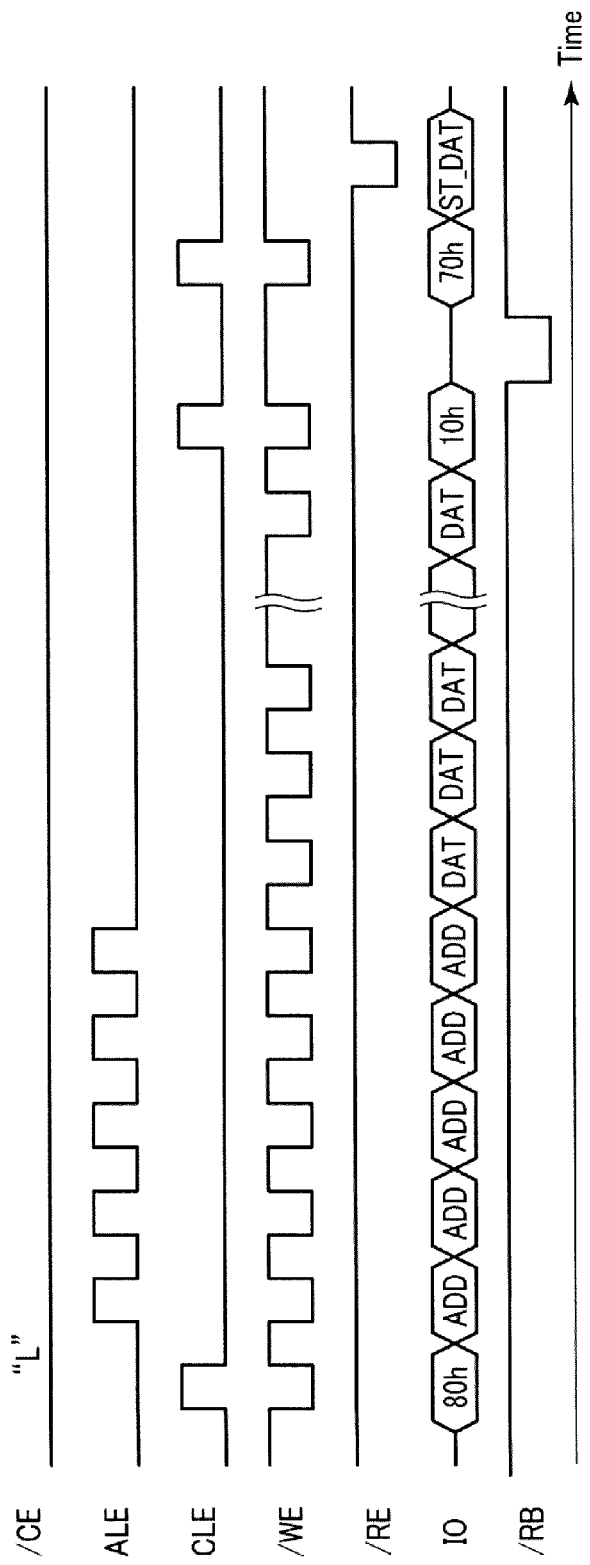

FIG. 14 is a timing chart of various signals on the NAND buses during operation of the step (2). After the second write command CMD_WR2 is received in the controller 200, the NAND interface circuit 230 issues a write command "80h", for example, under the control of the sequencer 250, and transmits the command to the NAND-type flash memory 100. Subsequently, an address ADD is transmitted to the NAND-type flash memory 100, for example, for 5 clock cycles, and write data DAT is transmitted to the NAND-type flash memory 100 for a plurality of clock cycles, and then a write command "10h" is issued and transmitted to the NAND-type flash memory 100. The address ADD includes addresses indicating a block, a page, and a column, held in the address register 290 in the operations illustrated in FIGS. 12 and 13.

An operation of writing the data in the memory cell array 110 is started in the NAND-type flash memory 100 in response to the command "10h", and thus the NAND-type flash memory 100 is brought into a busy state (/RB="L").

If writing of the data in the memory cell array 110 is completed, the NAND-type flash memory 100 is brought into a ready state. The controller 200 reads a status, issues a command "70h", and toggles the signal /RE, in response thereto. Then, status data ST_DAT indicating whether the writing operation is passed or failed is transmitted to the controller 200 in synchronization with the signal /RE. The status data ST_DAT is held in the feature table, and is read to the host apparatus 500 in response to the Get feature command in the step (3).

2.3 Erasing Operation

Next, the erasing operation will be described. The erasing operation substantially includes the following two steps.

(1) An erase (delete) command is issued from the host apparatus 500 to the controller 200.

(2) Feature table reading (Get feature): Through this step, whether the erasing operation on the NAND-type flash memory 100 is passed or failed is determined.

Figure 15:
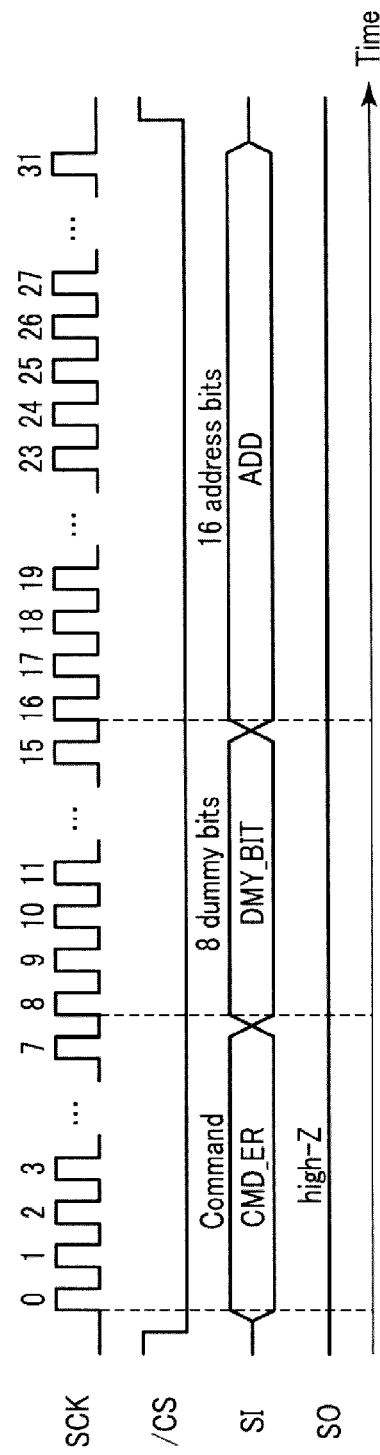

FIG. 15 is a timing chart of various signals on the SPI buses during execution of the step (1). As illustrated, the host apparatus 500 asserts the signal /CS, issues an erase command CMD_ER as the signal SI, and also issues the clock SCK. If the erase command CMD_ER is received, the sequencer 250 starts a data erasure sequence.

Next, the host apparatus 500 transmits 8 dummy bits DMY_BIT to the controller 200, for example, for 8 clock cycles, and then transmits a 16-bit address ADD to the controller 200, for example, for 16 clock cycles. The address ADD designates an erasure target block in the memory cell array 110, and is held in the address register 290. Subsequently, the host apparatus 500 deasserts the signal /CS.

The step (2) is performed following the step (1). A command sequence in this operation is the same as in FIG. 9 referred to for description of the reading operation. If the received status data ST_DAT indicates that the memory system 1 is in a ready state, the host apparatus 500 subsequently makes a request for information indicating whether erasure of the data is passed or failed.

FIG. 16 is a timing chart of various signals on the NAND buses during operation of the step (1). After the erase command CMD_ER is received in the controller 200, the NAND interface circuit 230 issues an erase command "60h", for example, under the control of the sequencer 250, and transmits the command to the NAND-type flash memory 100. Subsequently, an address ADD is transmitted to the NAND-type flash memory 100, for example, for 3 clock cycles, and then an erase command "D0h" is issued and is transmitted to the NAND-type flash memory 100.

An operation of erasing data from the memory cell array 110 is started in the NAND-type flash memory 100 in response to the command "D0h", and thus the NAND-type flash memory 100 is brought into a busy state (/RB="L").

If erasing of the data from the memory cell array 110 is completed, the NAND-type flash memory 100 is brought into a ready state. The controller 200 reads a status, issues a command "70h", and toggles the signal /RE, in response thereto. Then, status data ST_DAT indicating whether the erasing operation is passed or failed is transmitted to the controller 200 in synchronization with the signal /RE. The status data ST_DAT is held in the feature table, and is read to the host apparatus 500 in response to the Get feature command in the above (2).

3. Feature Table and Parameter Page 3.1 Feature Table

Next, the feature table will be described. FIG. 17 conceptually illustrates the feature table according to the present embodiment. As illustrated, the feature table includes three entries, and each entry has an 8-bit length. The entries are respectively allocated with addresses "B0h", "C0h", and "10h".

The following information is allocated to the entry related to the address "B0h" from the lowest bit in order.

Bit 0=reserved

Bit 1=high speed mode enable (HSE): This bit is a flag regarding a high speed mode related to page reading in the NAND-type flash memory 100, and indicates a normal mode with "0" and a high speed mode with "1". The high speed mode allows sequential pages to be read (reading of a plurality of pages having consecutive page addresses), and data can be read from the memory cell array 110 at a higher speed than in the normal mode.

Bit 2=bad block inhibit (BBI): This bit is a flag indicating whether a bad block inhibition function is valid, and indicates an invalid state with "0", and a valid state with "1", that is, a bad block is inhibited from being used.

Bit 3=reserved

Bit 4=ECC enable (ECC_E): This bit is a flag indicating whether an ECC function (in this example, the ECC circuit 620) in the memory system 1 is enabled or disabled, and disables with "0" and enables with "1".

Bit 5=reserved

Bit 6=ID read enable (IDR_E): This bit is a flag indicating whether parameter page reading is performed, and indicates a normal operation with "0" and the parameter page reading with "1". Details of the parameter page will be described below.

Bit 7=block protect enable (PRT_E): This bit is a flag indicating whether or not a block protection function in the NAND-type flash memory 100 is valid, and indicates an invalid state with "0" and a valid state with "1". If the function is valid, the memory system 1 can receive a Protect execute command issued by the host apparatus.

The entry related to the address "C0h" is as follows.

Bit 0=operation in progress (OIP): This bit is a flag indicating whether the memory system 1 is in a ready state or a busy state, and indicates the ready state with "0" and the busy state with "1"

Bit 1=write enable latch (WEL): This bit is a flag indicating whether writing of data is enabled or disabled, and indicates a disabled state with "0" and an enabled state with Bit 2=erase fail (ERS_F): This bit is a flag indicating whether or not a data erasing operation is failed, and indicates pass with "0" and failure with "1".

Bit 3=program fail (PRG_F): This bit is a flag indicating whether or not a data writing operation is failed, and indicates pass with "0" and failure with "1"

Bits 4 and 5=ECC status (ECCS): These bits indicate an error correction result in the controller 200, in which "00" indicates that no error is detected, "01" and "11" indicate that an error is corrected, and "10" indicates that an error cannot be corrected. "01" indicates that the number of corrected error bits is less than a threshold value designed by BFD (described below), and "11" indicates that the number of corrected error bits is equal to or more than the threshold value.

Bits 6 and 7=reserved

The entry related to the address "10h" is as follows.

Bits 0 to 3=reserved

Bits 4 to 7=BFD0 to BFD3: The threshold value of the number of error bits which is set in advance by the host apparatus 500

3.2 Set Feature Command

A value of each entry described in FIG. 17 may be arbitrarily set by the host apparatus 500 based on a feature table set command (also referred to as a Set feature command).

Figure 18:
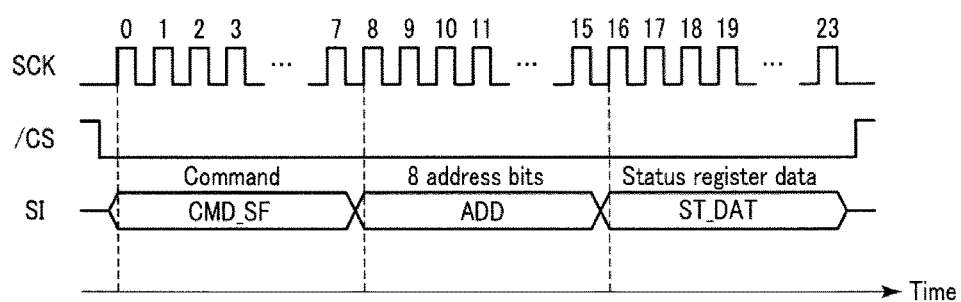
FIG. 18 is a timing chart of various signals during setting of information in the feature table according to the embodiment.

FIG. 18 is a timing chart of various signals on the SPI buses when a value is set in anyone of the entries of the feature table. As illustrated, the host apparatus 500 asserts the signal /CS, issues the Set feature command CMD_SF as the signal SI, and issues the clock SCK.

Next, the host apparatus 500 transmits an address ADD to the controller 200, for example, for 8 clock cycles. The address ADD is an address for designating an entry in which a value is set in the feature table, and is "B0h", "C0h", or "10h" in the example illustrated in FIG. 17. Subsequently, the host apparatus 500 transmits 8-bit data ST_DAT held in the designated entry. For example, if "B0h" is designated as an address, and the fourth-bit of the data ST_DAT is "0", the flag ECC_E in the feature table is set as "0", and the sequencer 250 disables the ECC circuit 620 based thereon.

3.3 Parameter Page

Next, a parameter page will be described. The parameter page register 610 (See FIG. 6 and FIG. 22) of the controller 200 holds information inherent to the memory system 1. FIG. 19 illustrates an example of information included in the parameter page.

As illustrated, the following information is included in each byte position of the parameter page.

Bytes 0 to 31: Reserved

Bytes 32 to 43: Information regarding a manufacturer of the NAND-type flash memory 100

Bytes 44 to 63: Device model information

Byte 64: Manufacturer ID

Bytes 65 to 79: Reserved

Bytes 80 to 83: The number of bytes per page (that is, a page size)

Bytes 84 and 85: The number of bytes of a spare area per page. The spare area is an area which can hold management information, control information, and the like other than net user data in one page.

Bytes 86 to 89: The number of bytes per partial page

Bytes 90 and 91: The number of bytes of a spare area per partial page

Bytes 92 to 95: A total number of pages per block

Bytes 96 to 99: A total number of blocks per logic unit

Byte 100: The number of logic units

Byte 101: Reserved

Byte 102: The number of bytes which can be held in one memory cell

Bytes 103 and 104: The maximum number of bad blocks allowed per unit

Bytes 105 and 106: Block reliability information

Byte 107: The number of valid blocks guaranteed at the beginning of use

Bytes 108 and 109: Reserved

Byte 110: The number of programs per page

Byte 111: Reserved

Byte 112: The number of ECC correction bits which is necessary in a host side

Bytes 113 to 127: Reserved

Byte 128: Input/output pin capacitance

Bytes 129 to 132: Reserved

Bytes 131 and 132: Program cache timing information

Bytes 133 and 134: The maximum page program time tPROG

Bytes 135 and 136: The maximum block erase time tBERS

Bytes 137 and 138: The maximum page read time tR

Bytes 139 to 253: Reserved

Bytes 254 and 255: CRC information

Bytes 256 to 511: Values of bytes 0 to 255

Bytes 512 to 767: Values of bytes 0 to 255

The above-described information is written using, for example, a tester by a manufacturer before shipment, for example, during manufacturing of the controller 200 or the memory system 1.

4. Parameter Page Reading Operation

Next, an operation during which the host apparatus 500 reads the parameter page from the memory system 1 will be described. The parameter page reading operation substantially includes the following six steps.

(1) Setting IDR_E to "1" with the Set feature command: Through this step, the parameter page reading operation is enabled.

(2) Reading data from the parameter page register 610: Through this step, parameter page data are read from the parameter page register 610, and stored in the data buffer(s) 260 and/or 270 of the controller 200.

(3) Feature table reading (referred to as Get feature in some cases): Through this step, whether the memory system 1 is in a busy state or a ready state is determined, that is, whether or not the operation in the step (2) is completed is determined.

(4) Update of the parameter page data in the controller 200: Through this step, the parameter page data are updated as necessary based on, for example, the information in the feature table.

(5) Reading data from the controller 200: Through this step, the parameter page data which is updated as necessary in the step (4) is read to the host apparatus 500.

(6) Setting IDR_E to "0" with the Set feature command: Through this step, the parameter page reading operation is disabled.

Figure 20:
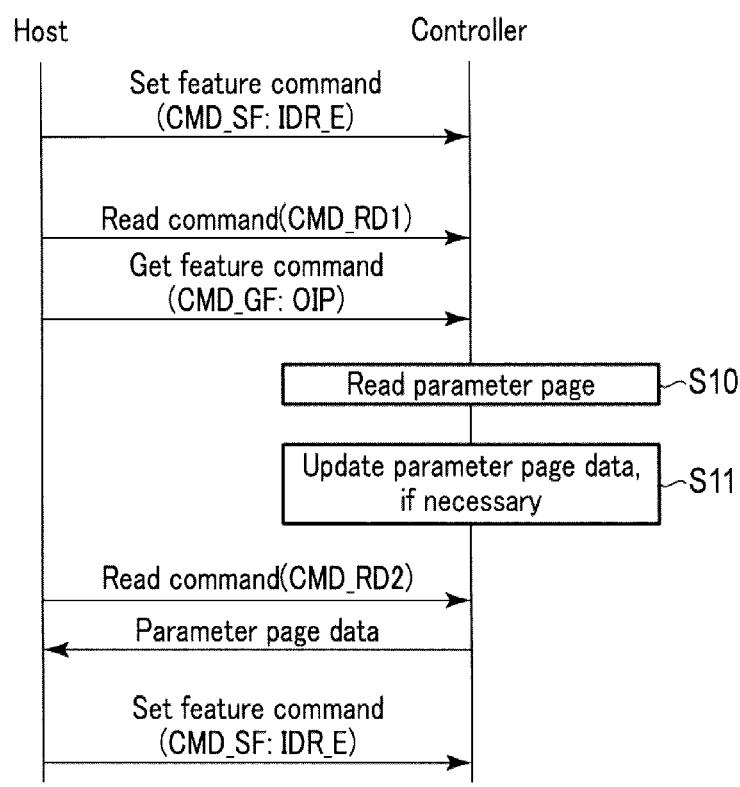
FIG. 20 is a flowchart illustrating a reading operation performed by the memory system according to the embodiment.
Figure 21:
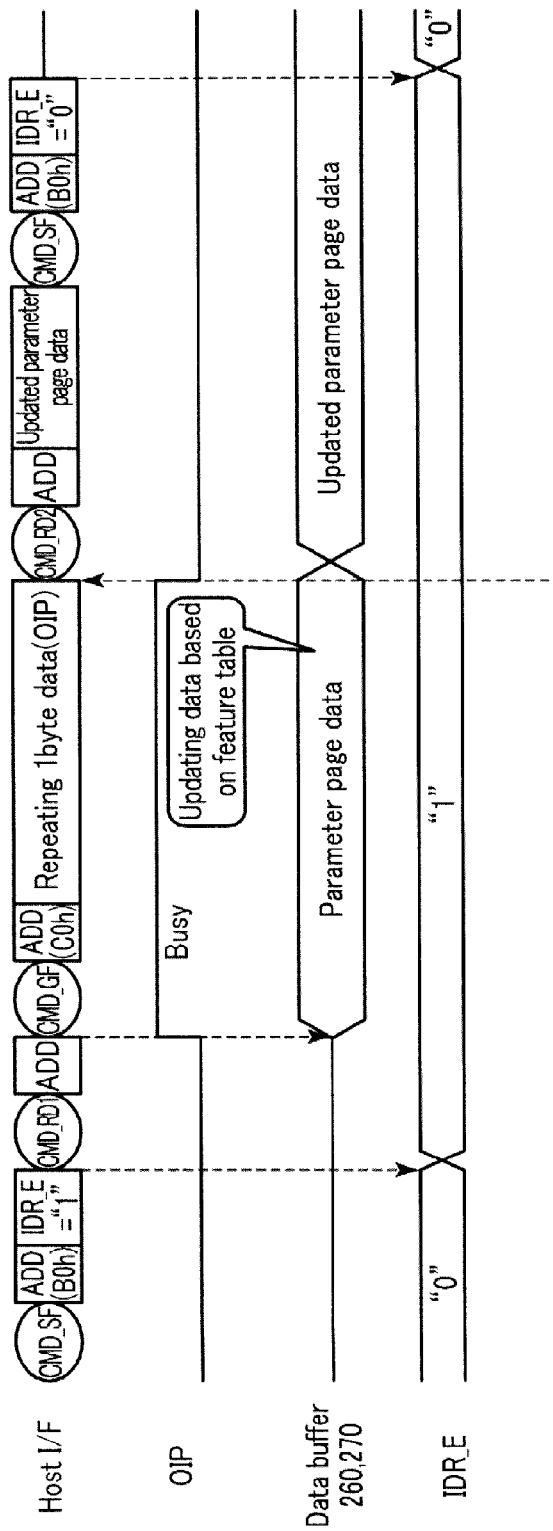
FIG. 21 is a command sequence during the reading operation of the memory system according to the embodiment.

Hereinafter, the parameter page reading operation will be described with reference to FIGS. 20 and 21. FIG. 20 is a flowchart illustrating operations of the host apparatus 500, the controller 200, and the NAND-type flash memory 100 during the reading operation, and FIG. 21 illustrates a command sequence.

As illustrated, first, the host apparatus 500 issues the Set feature command CMD_SF, and then an address ADD (="B0h"), and transmits entry data including IDR_E="1". As a result, the sequencer 250 of the controller 200 changes IDR_E in the feature table from "0" to "1". Consequently, the memory system 1 is brought into a parameter page reading mode.

Next, the host apparatus 500 issues the first read command CMD_RD1 and successively issues an address ADD. In response to the address ADD, the memory system 1 is brought into a busy state, and the OIP in the feature table becomes "1". The host apparatus 500 issues the Get feature command CMD_GF and an address ADD (="C0h"), and reads information (1-byte data) regarding the entry including the OIP from the feature table. The entry information is repeatedly transmitted to the host apparatus 500 until the OIP becomes "0" while the clock SCK is input (the Get feature command may be repeatedly issued).

When the memory system 1 is brought into a busy state, the controller 200 transfers the parameter page data held in the parameter page register to the data buffer(s) 260 and/or 270 (S10). For example, the sequencer 250 compares the information in the feature table with the parameter page data held in the data buffer 260 or 270, so as to check whether or not the information match each other. If the information do not match each other, the parameter page data are updated so as to match the information in the feature table (step S11).

For example, if the update is completed, the memory system 1 is brought into a ready state, and, for example, the sequencer 250 sets the OIP in the feature table from "1" as "0".

In response to the OIP becoming "0", the host apparatus 500 issues the second read command CMD_RD2, and reads the parameter page data in the data buffer 260 or 270, from the controller 200.

Thereafter, the host apparatus 500 issues the Set feature command CMD_ST again, so that IDR_E in the feature table is changed from "1" to "0", thereby returning the memory system to a normal mode.

Figure 22:
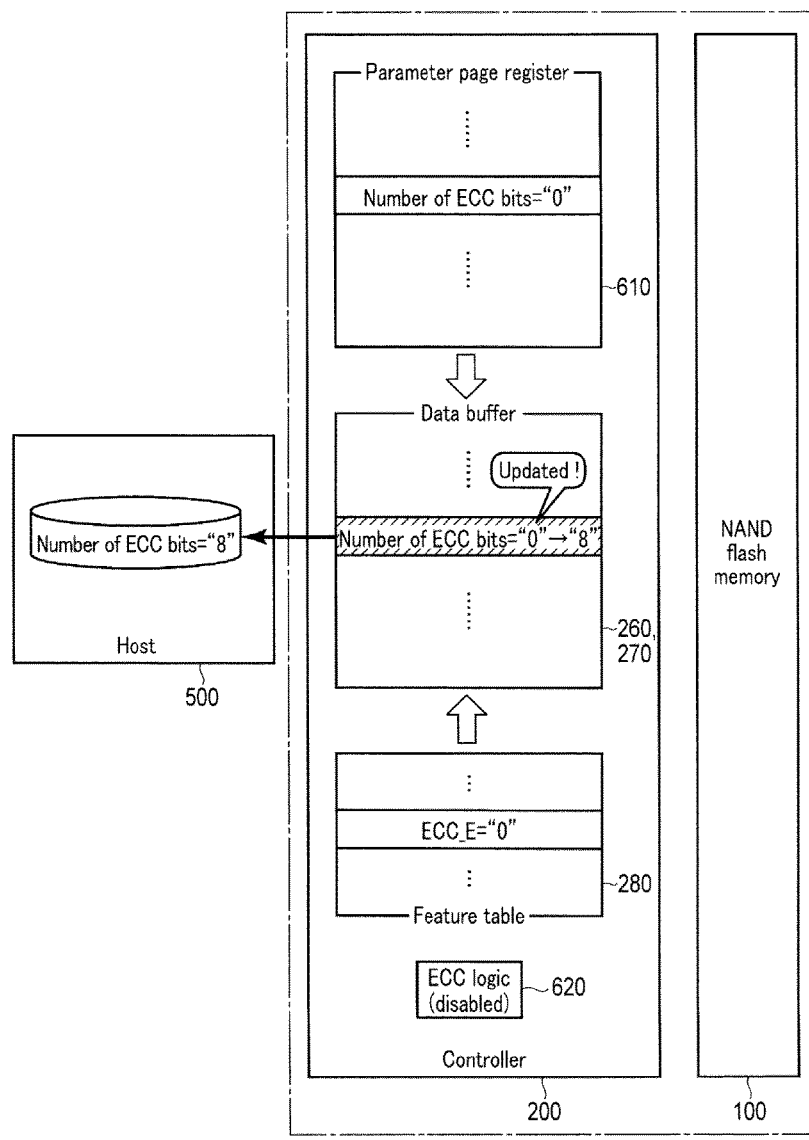
FIG. 22 schematically illustrates a specific example of the reading operation in the memory system according to the embodiment.

FIG. 22 illustrates a specific example of the parameter page reading operation. In this example, ECC_E in the feature table is set as "1" as a default, that is, the ECC circuit 620 is enabled, and the "number of ECC bits" is "0" in the parameter page. In other words, since the memory system 1 basically performs an ECC process, the number of bits required for the host apparatus 500 to perform the ECC process (the number of error correction bits required by the host apparatus) is 0.

In such an example, it is assumed that ECC_E is set as "0" through the Set feature command, and thus the ECC circuit 620 is disabled. FIG. 22 illustrates an example of a case where the host apparatus 500 reads the "number of ECC bits" stored in the byte 112 of the parameter page.

As illustrated, the parameter page data held in the parameter page register 610 is transmitted to the data buffers 260 and 270 without being changed. The "number of ECC bits" in the parameter page data is "0" at this time.

However, the sequencer 250 refers to ECC_E of the feature table. Then, ECC_E is "0", and thus the sequencer 250 recognizes that the ECC function of the memory system 1 is disabled. In other words, the sequencer 250 recognizes that the host apparatus 500 is required to perform the ECC process in this situation. Therefore, the sequencer 250 updates the "number of ECC bits" in the read parameter page data from "0" to "8" (in this example, it is assumed that the number of ECC bits in each sector is 8).

The controller 200 transmits the "number of ECC bits" updated to "8" to the host apparatus 500 in response to a command input from the host apparatus 500. Consequently, the host apparatus 500 can recognize that the host apparatus 500 is required to perform error correction of a maximum of 8 bits per sector with respect to the data read from the controller 200.

5. Advantage of Present Embodiment

According to the present embodiment, the host apparatus 500 can recognize the latest state of the memory system 1 and can thus perform the optimum operation. The advantage of the present embodiment will be described below in detail.

According to the present embodiment, the memory system 1 holds information regarding a page size or a redundant part size in a page, ECC correction performance which is required in a processor of the host side, and a timing specification such as writing time. The information is written, for example, during shipment of the memory system 1, and is not updated. The host apparatus 500 may read the information when the information is necessary, through a parameter page reading operation.

According to the present embodiment, the host apparatus 500 can change settings of the memory system 1 by using the Set feature command or the like. For this reason, settings of the memory system 1 when the host apparatus 500 requests the memory system 1 to transmit parameter page data may not match settings of parameter page data held in the parameter page register 610. This is as described in the example illustrated in FIG. 22.

In terms of this issue, in the present embodiment, the controller 200 updates parameter page data read from the parameter page register 610 to the latest information based on the information in the feature table. The updated parameter page data are transmitted in response to a request from the host apparatus 500. Therefore, the host apparatus 500 can recognize the latest state of the memory system 1 and can thus perform the optimum operation.

Of course, if parameter page data read from the parameter page register 610 matches the information in the feature table, the parameter page data may not be necessarily updated.

As described above, according to the present embodiment, the setting information in the parameter page can be a fixed value, and the latest information can be provided to the host apparatus 500.

6. Modification Examples and the Like

As described above, the memory system according to each of the above-described embodiments includes the first pin (pin No. 1 in FIG. 4) that can receive the chip select signal (/CS in FIG. 4) from the host apparatus; the second pin (pin No. 2 in FIG. 4) that can output the first signal (SO in FIG. 4) to the host apparatus; the third pin (pin No. 5 in FIG. 4) that can receive the second signal (SI in FIG. 4) from the host apparatus; the fourth pin (pin No. 6 in FIG. 4) that can receive the clock (SCK in FIG. 4) from the host apparatus; the interface circuit (210 or 220 in FIG. 6) that recognizes, as a command, the second signal which is received by the third pin immediately after the asserted chip select signal is received; the memory cell array (100 in FIG. 6) that includes the memory cell which can hold data and from which the data are read in the page unit; the table (the feature table in FIG. 17) that holds setting information of the memory system; and the register (the parameter page register in FIG. 6) that holds first data of the memory system. The memory system can update the first data (parameter page in FIG. 19) read from the register based on the setting information in the table (feature table) (step S12 in FIG. 20), and can transmit the updated first data to the host apparatus.

According to the present embodiment, the parameter page data read from the register is updated based on the information in the feature table, and the updated parameter page data are transmitted to the host apparatus. Consequently, the memory system can provide accurate information to the host apparatus.

Embodiments are not limited to the above-described embodiments, and may have various modifications. For example, in the above embodiments, the "number of ECC bits" in the read parameter page data is updated according to ECC_E in the feature table. However, embodiments are not limited thereto. For example, if the ECC function of the memory system 1 is disabled, ECC data (parity or the like) may not be written in the memory cell array 110. Therefore, there is a possibility that an ECC data area may be used as a user area. In other words, if ECC_E is "0", there is a possibility that a page size may be made larger than if ECC_E is "1". Therefore, in this case, the "number of data bytes per page" of the bytes 80 to 83 in the parameter page data described in FIG. 19 and/or the "number of spare bytes per page" may be updated.

If a plurality of reading modes is prepared in the memory system 1 (for example, a plurality of modes in which reading speeds are different from each other), for example, a timing mode of the bytes 129 and 130 or the maximum reading time of the bytes 137 and 138 in the parameter page data may be updated. The maximum write time of the bytes 133 and 134 may be updated, and any information in the parameter page data may be updated according to characteristics of the memory system 1.

The parameter page data includes fixed values and variable values. If the parameter page data is to be updated, the controller 200 compares the parameter page data with the feature table. In this case, the sequencer 250 may hold a correspondence relationship between each entry of the parameter page data and each bit of the feature page in advance. For example, the sequencer 250 associates ECC_E of the feature table with the "number of ECC bits", the "number of data bytes per page", and the "number of spare bytes per page" of the parameter page data. If ECC_E is changed, the information of the parameter page data associated therewith is updated.

In the above embodiments, a sequence during reading of the parameter page is the same as a sequence during reading of other normal data. However, during reading of the parameter page, the host apparatus 500 may issue a command which is different from a command during reading of normal data, and may perform a reading operation according to a sequence which is different from a sequence during reading of other normal data.

The feature table described with reference to FIG. 17 and the parameter page described with reference to FIG. 19 are only examples, and may include only some of the illustrated information, or may include other information.

In the above embodiments, the parameter page data in the parameter page register 610 is a fixed value and not rewritable. However, if the parameter page data are updated in the controller 200, the updated parameter page data may be written in the parameter page register 610 as new parameter page data.

Figure 23:
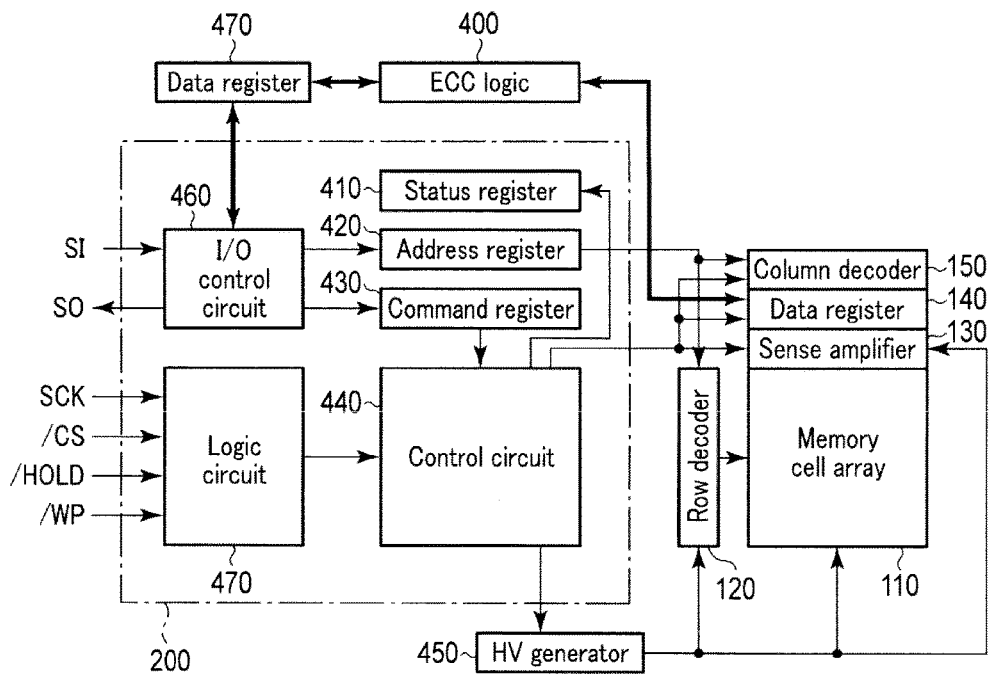
FIG. 23 is a block diagram of a memory system according to a modification example of the embodiment.

For example, in the above embodiments, the NAND-type flash memory 100 and the controller chip 200 are separate semiconductor chips. However, the elements may be formed of one chip. FIG. 23 is a block diagram of the memory system 1 in this case.

As illustrated, a block configuration is the same as in FIG. 7, but the signals SCK, /CS, /HOLD, and /WP from the host apparatus 500 are input to the logic circuit 470, and the signals SI and SO are input and output via the input/output control circuit 460. The registers 410 and 430, the control circuits 440 and 460, and the logic circuit 470 function as the controller 200. In other words, the control circuit 440 functions as the sequencer 250 and the host interface circuit 220, and recognizes commands from the host apparatus 500 from each other by using the signal /CS. The input/output control circuit 460 and the logic circuit 470 function as the host input/output circuit 210. The registers 410 and 420 function as the registers 280 and 290, and the feature table is held in, for example, the status register 410 or the like.

The parameter page data may be held in the NAND-type flash memory 100. In other words, the controller 200 may read the parameter page from the NAND-type flash memory 100, and the ECC circuit 620 may perform ECC decoding on the parameter page data during reading of data.

In the configuration described with reference to FIGS. 6 and 7, the ECC circuit 620 may be included in the NAND-type flash memory 100. In other words, the NAND-type flash memory 100 may detect and correct an error. In this case, for example, the NAND-type flash memory 100 may perform an ECC process on the parameter page data.

The respective processes in the above-described flowcharts may be changed in order of the processes as appropriate. The timing charts described in the above embodiments are only examples. The number of clocks which are required to input the signal SI or the number of clocks which are required to output the signal SO are not limited to those in the above embodiments. A case where dummy bits are input immediately after a command is issued depending on the command is described as an example, and input of a command is not limited thereto. This is also the same for the feature table, and is not limited to the form described in the embodiments as long as the information described in the embodiments can be held therein.

Figure 24:
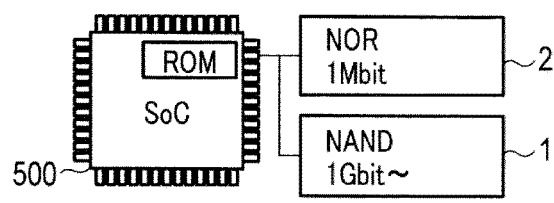
FIGS. 24 and 25 are each a conceptual diagram of a system using the memory system according to one or more embodiments.

The memory system described in the above embodiment may be used to activate an application of, for example, a television set or a set top box. FIG. 24 illustrates an example of such a system. In the present example, a NOR-type flash memory 2 is provided in addition to the memory system 1. Both the memory system 1 and the NOR-type flash memory 2 are connected to an SPI interface. In the present example, commands (the commands CMD_RD1, CMD_RD2, CMD_GF, and CMD_SF, and the like) for controlling the memory system 1 are held in the NOR-type flash memory 2. During activation of the host apparatus 500, the host apparatus 500 reads the command information from the NOR-type flash memory 2 according to a sequence held in a ROM of the host apparatus 500. The host apparatus 500 reads an activation sequence from the memory system 1 by using the command information, and the application is activated by executing the activation sequence.

Figure 25:
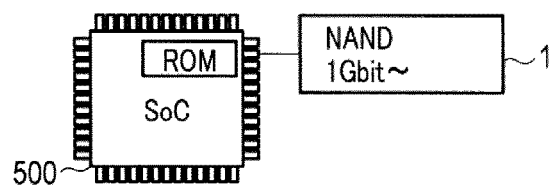

Alternatively, if the command information regarding the memory system 1 is held in the ROM of the host apparatus 500, the NOR-type flash memory 2 may be omitted as illustrated in FIG. 25.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
a semiconductor memory unit; and
a controller circuit configured to communicate with a host through a serial interface and access the semiconductor memory unit through a NAND interface circuit in response to commands received through the serial interface, and including a first register in which parameters of the memory device are stored, wherein
the controller circuit, in response to a host command to read parameters of the memory device, updates at least one of the parameters of the memory device stored in the first register based on operational settings of the memory device, and transmits the updated parameters through the serial interface to the host, and
the controller circuit includes an error-correcting code (ECG) circuit configured to perform error correction processes, one of the operational settings including an ECC setting either to enable the ECC circuit to perform the error correction processes or to disable the ECC circuit when the host performs the error correction processes, the parameters of the memory device stored in the first register including an error-bit parameter that indicates a number of error bits to be corrected by the host, wherein
the controller circuit, in response to a host command to read the error-bit parameter, updates the number of error bits to be corrected by the host, based on the ECC setting, such that when the number of error bits to be corrected by the host is zero and the ECC circuit is in a disabled state in accordance with the ECC setting, the number of error bits to be corrected by the host is updated to a number greater than zero.

2. The memory device according to claim 1, wherein the parameters of the memory device stored in the first register are factory-set parameters and are unchangeable.

3. The memory device according to claim 2, wherein the controller circuit, in response to a host command to change one or more of the operational settings, changes the operational settings in accordance with the host command.

4. The memory device according to claim 1, wherein the semiconductor memory unit logically divided into a plurality of pages,
the parameters of the memory device stored in the first register include a page-size parameter indicating a page size of each of the pages, and
the controller circuit, in response to a host command to read the page-size parameter, updates the page-size parameter based on the ECC setting.

5. The memory device according to claim 4, wherein when the ECC circuit is in a disabled state in accordance with the ECC setting, the page-size parameter is increased to a larger size.

6. The memory device according to claim 1, wherein the parameters of the memory device are stored in the semiconductor memory unit, and loaded into the first register from the semiconductor memory unit.

7. The memory device according to claim 1, wherein the serial interface conforms to Serial Peripheral Interface (SPI).

8. The memory device according to claim 1, wherein the controller circuit includes a second register in which operational settings of the memory device are stored.

9. A method for communicating a parameter of a memory device from the memory device to a host through a serial interface, the memory device including a controller, an error-correcting code (ECC) circuit configured to perform error correction processes, and a semiconductor memory unit, the controller including a first register and a second register and accessing the semiconductor memory unit through a NAND interface circuit, the method comprising:
storing operational settings of the memory device in the first register, wherein one of the operational settings is an ECC setting to enable the ECC circuit to perform the error correction processes and to disable the ECC circuit when the host performs the error correction processes; and
in response to a host command to read parameters of the memory device, updating at least one of the parameters of the memory device stored in the second register based on the operational settings, and transmitting the updated parameters through the serial interface to the host, wherein
the parameters of the memory device stored in the second register include an error-bit parameter that indicates a number of error bits to be corrected by the host, and in response to a host command to read the error-bit parameter, the number of error bits to be corrected by the host is updated based on the ECC setting, such that when the number of error bits to be corrected by the host is zero and the ECC circuit is in a disabled state in accordance with the ECC setting, the number of error bits to be corrected by the host is updated to a number greater than zero.

10. The method according to claim 9, wherein the parameters of the memory device stored in the second register are factory-set parameters and are unchangeable.

11. The method according to claim 10, wherein in response to a host command to change one or more of the operational settings, changing the operational settings in accordance with the host command.

12. The method according to claim 9, wherein
the memory device include a semiconductor memory unit logically divided into a plurality of pages,
the parameters of the memory device stored in the second register include a page-size parameter indicating a page size of each of the pages, and
in response to a host command to read the page-size parameter, the page-size parameter is updated based on the ECC setting.

13. The method according to claim 12, wherein
when the ECC circuit is in a disabled state in accordance with the ECC setting, the page-size parameter is increased to a larger size.

14. A method for communicating a parameter of a memory device from the memory device to a host through a serial interface, the memory device including a controller and a semiconductor memory unit, the controller including a first register and a second register and accessing the semiconductor memory unit through a NAND interface circuit, the method comprising:

storing operational settings of the memory device in the first register, wherein one of the operational settings is an information indicating whether or not a block protection function in the semiconductor memory unit is valid; and in response to a host command to read parameters of the memory device updating at least one of the parameters of the memory device stored in the second register based on the operational settings, and transmitting the updated parameters through the serial interface to the host, wherein the parameters of the memory device stored in the second register are factory-set parameters and are unchangeable, and in response to a host command to change one or more of the operational settings, changing the operational settings in accordance with the host command.

\* \* \* \* \*